US009276022B2

(12) United States Patent
Bui et al.

(10) Patent No.: US 9,276,022 B2
(45) Date of Patent: Mar. 1, 2016

(54) LOW CROSSTALK, FRONT-SIDE ILLUMINATED, BACK-SIDE CONTACT PHOTODIODE ARRAY

(75) Inventors: Peter Steven Bui, Westminster, CA (US); Narayan Dass Taneja, Long Beach, CA (US)

(73) Assignee: OSI Optoelectronics, Inc., Hawthorne, CA (US)

( * ) Notice: Subject to any disclaimer, the term of this patent is extended or adjusted under 35 U.S.C. 154(b) by 992 days.

(21) Appl. No.: 13/248,172

(22) Filed: Sep. 29, 2011

(65) Prior Publication Data

US 2012/0104532 A1    May 3, 2012

Related U.S. Application Data

(63) Continuation of application No. 11/422,246, filed on Jun. 5, 2006, now Pat. No. 8,120,023.

(51) Int. Cl.
*H01L 29/00* (2006.01)
*H01L 27/144* (2006.01)
*H01L 27/146* (2006.01)
(Continued)

(52) U.S. Cl.
CPC ...... *H01L 27/1446* (2013.01); *H01L 27/14643* (2013.01); *H01L 31/02016* (2013.01); *H01L 31/18* (2013.01); *H01L 27/14689* (2013.01)

(58) Field of Classification Search
USPC .......... 257/46, 107, 120, 126, 128, 446, 448, 257/452, 459, E27.129, E27.133; 438/142; 250/211, 220
See application file for complete search history.

(56) References Cited

U.S. PATENT DOCUMENTS 3,041,226 A     6/1962  Pennington
3,604,987 A  *  9/1971  Assour .......................... 257/443
(Continued)

FOREIGN PATENT DOCUMENTS

EP    0 347 157      12/1989
EP    0436282 A2    7/1991
(Continued)

OTHER PUBLICATIONS

Y. Atatsu, Y. Muramoto, K. Kato, M. Ikeda, M. Ueki, A. Kozen, T. Kurosaki, K. Kawano, and J. Yoshida, "Long-wavelength multimode waveguide photodiodes suitable for hybrid optical module integrated with planar lightwave circuit", Electron. Lett., vol. 31, pp. 2098-2100, 1995.

(Continued)

*Primary Examiner* — Meiya Li
(74) *Attorney, Agent, or Firm* — Novel IP (57) ABSTRACT

The present application is directed to novel front side illuminated, back side contact photodiodes and arrays thereof. In one embodiment, the photodiode has a substrate with at least a first and a second side and a plurality of electrical contacts physically confined to the second side. The electrical contacts are in electrical communication with the first side through a doped region of a first type and a doped region of a second type, each of the regions substantially extending from the first side through to the second side. In another embodiment, the photodiode includes a wafer with at least a first and a second side; and a plurality of electrical contacts physically confined to the second side, where the electrical contacts are in electrical communication with the first side through a diffusion of a p+region through the wafer and a diffusion of an n+region through the wafer.

11 Claims, 11 Drawing Sheets

(51) Int. Cl.
*H01L 31/02* (2006.01)
*H01L 31/18* (2006.01)

(56) References Cited

U.S. PATENT DOCUMENTS

| | | |
|---|---|---|
| 3,713,921 A | 1/1973 | Fleischer |
| 3,765,969 A | 10/1973 | Kragness |
| 3,801,390 A | 4/1974 | Lepselter |
| 3,808,068 A | 4/1974 | Johnson |
| 3,895,976 A | 7/1975 | Dumas |
| 3,982,269 A | 9/1976 | Torreno et al. |
| 4,079,405 A | 3/1978 | Ohuchi |
| 4,210,923 A | 7/1980 | North |
| 4,290,844 A | 9/1981 | Rotolante |
| 4,616,247 A | 10/1986 | Chang |
| 4,857,980 A | 8/1989 | Hoeberechts |
| 4,874,939 A | 10/1989 | Nishimoto et al. |
| 4,887,140 A | 12/1989 | Wang |
| 4,904,608 A | 2/1990 | Gentner et al. |
| 4,904,861 A | 2/1990 | Epstein et al. |
| 4,998,013 A | 3/1991 | Epstein et al. |
| 5,040,039 A | 8/1991 | Hattori |
| 5,049,962 A | 9/1991 | Huang |
| 5,053,318 A | 10/1991 | Gulla |
| 5,144,379 A | 9/1992 | Eshita et al. |
| 5,214,276 A | 5/1993 | Himoto et al. |
| 5,237,197 A | 8/1993 | Snoeys et al. |
| 5,252,142 A | 10/1993 | Matsuyama et al. |
| 5,252,851 A | 10/1993 | Mita |
| 5,254,480 A | 10/1993 | Tran |
| 5,276,955 A | 1/1994 | Noddin et al. |
| 5,315,148 A | 5/1994 | Fujimura |
| 5,408,122 A | 4/1995 | Reele |
| 5,414,295 A | 5/1995 | LeRoux |
| 5,418,396 A | 5/1995 | Mita |
| 5,430,321 A | 7/1995 | Effelsberg |
| 5,446,308 A | 8/1995 | Piccone |
| 5,446,751 A | 8/1995 | Wake |
| 5,501,990 A | 3/1996 | Holm et al. |
| 5,517,052 A | 5/1996 | Ishaque |
| 5,543,736 A | 8/1996 | Gardner |
| 5,576,559 A | 11/1996 | Davis |
| 5,599,389 A | 2/1997 | Iwasaki |
| 5,608,237 A | 3/1997 | Alzawa et al. |
| 5,656,508 A | 8/1997 | So et al. |
| 5,670,383 A | 9/1997 | Piccone |
| 5,670,817 A | 9/1997 | Robinson |
| 5,698,454 A | 12/1997 | Zommer |
| 5,777,352 A | 7/1998 | Reele |
| 5,818,096 A | 10/1998 | Ishibashi et al. |
| 5,825,047 A | 10/1998 | Ajisawa et al. |
| 5,869,834 A | 2/1999 | Wipenmyr |
| 5,880,482 A | 3/1999 | Adesida |
| 5,889,313 A | 3/1999 | Parker |
| 5,914,502 A | 6/1999 | Simmonet |
| 5,923,720 A | 7/1999 | Barton et al. |
| 5,928,438 A | 7/1999 | Salami et al. |
| 6,027,956 A | 2/2000 | Irissou |
| 6,031,254 A | 2/2000 | Quoirin |
| 6,075,275 A | 6/2000 | Irissou |
| 6,144,379 A | 11/2000 | Bertram |
| 6,169,319 B1 | 1/2001 | Malinovich |
| 6,175,141 B1 | 1/2001 | Hofbauer |
| 6,204,087 B1 | 3/2001 | Parker |
| 6,218,684 B1 | 4/2001 | Kuhara et al. |
| 6,218,704 B1 | 4/2001 | Brown |
| 6,277,668 B1 | 8/2001 | Goossen |
| 6,303,967 B1 | 10/2001 | Irissou |
| 6,326,300 B1 | 12/2001 | Liu |
| 6,326,649 B1 | 12/2001 | Chang et al. |
| 6,352,517 B1 | 3/2002 | Flock et al. |
| 6,399,991 B1 | 6/2002 | Ando |
| 6,426,991 B1 | 7/2002 | Mattson et al. |
| 6,438,296 B1 | 8/2002 | Kongable |
| 6,458,619 B1 | 10/2002 | Irissou |
| 6,483,130 B1 | 11/2002 | Yang |
| 6,489,635 B1 | 12/2002 | Sugg |
| 6,504,158 B2 | 1/2003 | Possin |
| 6,504,178 B2 | 1/2003 | Carlson |
| 6,507,050 B1 | 1/2003 | Green |
| 6,510,195 B1 | 1/2003 | Chappo et al. |
| 6,541,836 B2 | 4/2003 | Iwanczyk |
| 6,546,171 B2 | 4/2003 | Fukutomi |
| 6,569,700 B2 | 5/2003 | Yang |
| 6,593,636 B1 | 7/2003 | Bui et al. |
| 6,667,528 B2 | 12/2003 | Cohen et al. |
| 6,670,258 B2 | 12/2003 | Carlson et al. |
| 6,690,078 B1 | 2/2004 | Irissou |
| 6,734,416 B2 | 5/2004 | Carlson et al. |
| 6,762,473 B1 | 7/2004 | Goushcha |
| 6,772,729 B2 | 8/2004 | Brosseau |
| 6,815,790 B2 | 11/2004 | Bui et al. |
| 6,826,080 B2 | 11/2004 | Park et al. |
| 7,019,338 B1 | 3/2006 | Ballon |
| 7,057,254 B2 | 6/2006 | Bui |
| 7,112,465 B2 | 9/2006 | Goushcha |
| 7,161,155 B1 | 1/2007 | Deych |
| 7,198,972 B2 | 4/2007 | Sato |
| 7,242,069 B2 | 7/2007 | Bui |
| 7,256,470 B2 | 8/2007 | Bui |
| 7,279,731 B1 | 10/2007 | Bui |
| 7,622,785 B2 | 11/2009 | Sasagawa |
| 7,649,236 B2 | 1/2010 | Fujii |
| 2001/0034105 A1 | 10/2001 | Carlson |
| 2002/0020893 A1 | 2/2002 | Lhorte |
| 2002/0056845 A1 | 5/2002 | Iguchi et al. |
| 2002/0148967 A1 | 10/2002 | Iwanczyk |
| 2003/0116187 A1 | 6/2003 | Husher |
| 2004/0104351 A1 | 6/2004 | Shibayama |
| 2004/0129991 A1 | 7/2004 | Lai et al. |
| 2004/0135170 A1 | 7/2004 | Menard |
| 2004/0206886 A1 | 10/2004 | Carlson |
| 2004/0222358 A1 | 11/2004 | Bui et al. |
| 2004/0222482 A1 | 11/2004 | Bui et al. |
| 2004/0241897 A1 | 12/2004 | Rhee |
| 2004/0262652 A1 | 12/2004 | Goushcha et al. |
| 2005/0082640 A1 | 4/2005 | Takei et al. |
| 2005/0184354 A1 | 8/2005 | Chu |
| 2005/0186754 A1 | 8/2005 | Kim |
| 2006/0220078 A1 | 10/2006 | Bui et al. |
| 2006/0255420 A1 | 11/2006 | Bui |
| 2006/0278896 A1 | 12/2006 | Inoue |
| 2006/0278898 A1 | 12/2006 | Shibayama |
| 2007/0090394 A1 | 4/2007 | Bui |
| 2007/0257329 A1 | 11/2007 | Bui |
| 2007/0278534 A1 | 12/2007 | Bui |
| 2007/0296005 A1 | 12/2007 | Bui |
| 2008/0067622 A1 | 3/2008 | Bui et al. |
| 2008/0128846 A1 | 6/2008 | Bui |
| 2008/0277753 A1 | 11/2008 | Bui |
| 2011/0079728 A1 | 4/2011 | Garcia |

FOREIGN PATENT DOCUMENTS

| | | |
|---|---|---|
| EP | 0 723 301 A2 | 5/1997 |
| EP | 0 723 301 B1 | 7/2000 |
| EP | 1 069 626 A2 | 1/2001 |
| EP | 1 205 983 A1 | 5/2002 |
| WO | WO/00/52766 | 9/2000 |

OTHER PUBLICATIONS

Fukano et al., "High-REsponsivity and Low-Operation-Voltage Edge-Illuminated Refracting-Facet Photodiodes with Large Alignment Tolerance for Single-Mode Fiber", Journal of Lightwave Technology, vol. 16, No. 5, May 1997.

* cited by examiner

LOW CROSSTALK, FRONT-SIDE ILLUMINATED, BACK-SIDE CONTACT PHOTODIODE ARRAY

CROSS-REFERENCE

The present application is a continuation of U.S. patent application Ser. No. 11/422,246, filed on Jun. 5, 2006 now U.S. Pat. No. 8,120,023.

FIELD

The present application relates generally to the field of radiation detectors, and in particular, relates to a front-side illuminated, back-side contact photodiode array, comprising at least a plurality of heavily doped deep regions, including n+ deep diffused, p+ deep diffused, and p+ simple diffused, for forming front to back connections. Still more particularly, the present application relates to photodiode arrays that can be manufactured quickly and with low cost and which exhibit substantially zero crosstalk due to active area isolation.

BACKGROUND

Photosensitive diode arrays or photodiodes are used in an assortment of applications including radiation detection, optical position encoding, and low light-level imaging, such as night photography, nuclear medical imaging, photon medical imaging, multi-slice computer tomography (CT) imaging, and ballistic photon detection. Typically, photodiode arrays may be formed as one- or two-dimensional arrays of aligned photodiodes, or, for optical shaft encoders, a circular or semi-circular arrangement of diodes.

One disadvantage with conventional detection devices is the amount and extent of crosstalk that occurs between adjacent detector structures, primarily as a result of minority carrier current between diodes. The problem of crosstalk between diodes becomes even more acute as the size of the detector arrays, the size of individual detectors, the spatial resolution, and spacing of the diodes is reduced.

More specifically, crosstalk occurs when photogenerated carriers, that are a result of incident light upon an active area of an individual photodiode unit, are not completely collected via the electrical contacts of that particular photodiode unit. Thus, a number of photogenerated carriers, and more particularly, those that are generated in the portion external to the depletion region, diffuse away from their point of generation and get collected or captured by electrical contacts of neighboring photodiode units. Photogenerated charge carriers therefore "random walk" while diffusing laterally through a layer of semiconductor material until an active area, which may be located a significant distance away from the point of origin of the charge carrier, collects them. The end result is a form of signal noise resulting from crosstalk between the photodiodes, and is the principal cause of electrical crosstalk.

In certain applications, it is desirable to produce optical detectors having small lateral dimensions and spaced closely together. For example in certain medical applications, it would beneficial to increase the optical resolution of a detector array in order to permit for improved image scans, such as computer tomography scans. However, at conventional doping levels utilized for diode arrays of this type, the diffusion length of minority carriers generated by photon interaction in the semiconductor is in the range of at least many tens of microns, and such minority carriers have the potential to affect signals at diodes away from the region at which the minority carriers were generated. Therefore, the spatial resolution obtainable may be limited by diffusion of the carriers within the semiconductor itself, even if other components of the optical system are optimized and scattered light is reduced.

Various approaches have been used to minimize crosstalk including, but not limited to, providing inactive photodiodes to balance the leakage current and using conventional two-dimensional or three-dimensional structures, such as trenches, moats, or insulating structures between photodiodes or other active devices to provide isolation between the devices.

For example, U.S. Pat. No. 4,904,861, assigned to Agilent Technologies, Inc., discloses "an optical encoder comprising: a plurality of active photodiodes in an array on a semiconductor chip; a code member having alternating areas for alternately illuminating and not illuminating the active photodiodes in response to movement of the code member; means connected to the active photodiodes for measuring current from the active photodiodes; and sufficient inactive photodiode area on the semiconductor chip at each end of the array of active photodiodes to make the leakage current to each end active photodiode of the array substantially equal to the leakage current to an active photodiode remote from an end of the array". Similarly, U.S. Pat. No. 4,998,013, also assigned to Agilent Technologies, Inc. discloses "means for shielding a photodiode from leakage current comprising: at least one active photodiode on a semiconductor chip; means for measuring current from the active photodiode; a shielding area having a photodiode junction substantially surrounding the active photodiode; and means for biasing the shielding area photodiode junction with either zero bias or reverse bias."

U.S. Pat. No. 6,670,258, assigned to Digirad Corporation, discloses "a method of fabricating a low-leakage current photodiode array comprising: defining frontside structures for a photodiode on a front side of a substrate; forming a heavily-doped gettering layer on a back surface of the substrate; carrying out a gettering process on the substrate to transport undesired components from the substrate to said gettering layer, and to form another layer in addition to said gettering layer, which is a heavily-doped, conductive, crystalline layer within the substrate; after said gettering process, removing the entire gettering layer; and after said removing, thinning the heavily-doped, conductive, crystalline layer within the substrate to create a native optically transparent, conductive bias electrode layer".

U.S. Pat. No. 6,569,700, assigned to United Microelectronics Corporation, discloses "a method of reducing leakage current of a photodiode on a semiconductor wafer, the surface of the semiconductor wafer comprising a p-type substrate, a photosensing area for forming a photosensor of the photodiode, and a shallow trench positioned in the substrate surrounding the photosensing area, the method comprising: forming a doped polysilicon layer containing p-type dopants in the shallow trench; using a thermal process to cause the p-type dopants in the doped polysilicon layer to diffuse into portions of the p-type substrate that surround a bottom of the shallow trench and walls of the shallow trench; removing the doped polysilicon layer; filling an insulator into the shallow trench to form a shallow trench isolation (STI) structure; performing a first ion implantation process to form a first n-type doped region in the photosensing area; and performing a second ion implantation process to form a second n-type doped region in the photosensing area."

These prior art approaches, however, are typically not well suited to forming closely spaced miniaturized diode arrays, wherein the spacing between diodes should be in the range of a few microns. In addition, these prior art approaches require the use of complex processing and manufacturing steps that include the passivation of p-n junctions exposed by trenches between the active regions.

Many attempts have been made in the prior art towards isolating the active area of the photodiode array, including the use of 2D or 3D isolation structures and isolation films. For example, U.S. Pat. No. 6,826,080 by Park et al. discloses "a virtual ground nonvolatile semiconductor memory array integrated circuit structure comprising: a plurality of nonvolatile memory cells organized in a plurality of rows and columns, the memory cells being disposed in active areas of the integrated circuit; a plurality of row lines extending generally parallel to respective rows of the memory cells; a plurality of column lines extending generally parallel to respective columns of the memory cells; and an isolation structure disposed between each of the rows of memory cells and between adjacent columns of the memory cells at regular intervals throughout the memory array for electrically isolating the active areas from one another."

Despite attempts in the prior art to improve the overall performance characteristics of photodiode arrays and their individual diode units, within detection systems, photodiode arrays capable of reducing crosstalk are still needed. Additionally, there is need for a semiconductor circuit and an economically feasible design and fabrication method so that it is capable of improving substantially reducing crosstalk.

In addition, there is a need for a front-side illuminated, back-side contact (FSL-BSC) photodiode arrays having superior characteristics, including low manufacturing cost via thermal budget processing; low crosstalk effects owing to active area isolation; and front to back intrachip electrical connections.

SUMMARY

The present application is directed to novel front side illuminated, back side contact photodiodes and arrays thereof. In one embodiment, the photodiode comprises a substrate having at least a first and a second side and a plurality of electrical contacts physically confined to said second side, wherein the electrical contacts are in electrical communication with said first side through a doped region of a first type and a doped region of a second type, each of said regions substantially extending from said first side through to said second side.

Optionally, the doped region of a first type is a n+ doped region. Optionally, the doped region of a first type is in electrical communication with electrical contact comprising n+ metal. Optionally, the doped region of a second type is a p+ doped region. Optionally, the doped region of a second type is in electrical communication with electrical contact comprising p+ metal. Optionally, the photodiode comprises a region for receiving incident light on said first side. Optionally, the doped region of a third type is a p+ doped region.

In one embodiment, the photodiode is manufactured by performing a mask oxidation on the first and second sides; implementing an n+ photolithography on the first and second sides; performing an n+ diffusion followed by drive in oxidation on the first and second sides; implementing a first p+ photolithography on the first and second sides; performing a p+ diffusion followed by drive in oxidation on the first and second sides; implementing a deep drive in step; implementing a second p+ photolithography on the front side; performing a p+ diffusion followed by growth of an anti-reflective (AR) layer; implementing a contact window photolithography on the second side; and performing metal deposition followed by etching the metal on the first and second sides.

Optionally, the substrate comprises silicon. Optionally, the first side and second sides form the front and back sides of a substrate wafer.

In one embodiment, the method of fabricating a front side illuminated backside contact photodiode array wherein each photodiode comprises a front side and a backside with a substrate, comprises the steps of performing a mask oxidation on both front and back sides of a substrate to form a protective layer thereupon; implementing an n+ photolithography on both front and back sides of the substrate to define a first assemblage of at least a plurality of regions thereupon; performing an n+ diffusion followed by drive in oxidation on the first assemblage of regions, confined to both front and back sides of the substrate, for the formation of n+ diffusion regions; implementing a first p+ photolithography on both front and back sides of the substrate to define a second assemblage of at least a plurality of regions thereupon; performing a p+ diffusion followed by drive in oxidation on the second assemblage of regions, confined to both front and back sides of the substrate, for the formation of p+ diffusion regions therupon; implementing a deep drive in step on the first and second assemblage of selected regions, confined to both front and back sides of the substrate, thereby resulting in the formation of n+ and p+ deep diffusion regions thereupon; implementing a second p+ photolithography on the front side of the substrate to define a third assemblage comprising at least a plurality of selected regions thereupon; performing a p+ diffusion followed by growth of an anti-reflective (AR) layer on the third assemblage of selected regions, confined to front side of the substrate, for the formation of p+ diffusion regions thereupon; implementing a contact window photolithography on the back side of the substrate to etch a contact window oxide layer formed atop n+ and p+ diffusion regions; and performing metal deposition photolithography to etch a metal layer deposited on the backside of the substrate thereby facilitating development of connection to the n+ and p+ diffusion regions.

In one embodiment, the photodiode comprises a wafer having at least a first and a second side; and a plurality of electrical contacts physically confined to said second side, wherein the electrical contacts are in electrical communication with said first side through a diffusion of a p+ region through said wafer and a diffusion of an n+ region through said wafer. The photodiode comprises a region for receiving incident light on said first side.

BRIEF DESCRIPTION OF THE DRAWINGS

These and other features and advantages of the present application will be appreciated, as they become better understood by reference to the following detailed description when considered in connection with the accompanying drawings, wherein.

DETAILED DESCRIPTION

The present application is directed towards detector structures, detector arrays, and design and manufacture of detector arrays for an assortment of applications including, but not limited to, computerized tomography (CT) and non-CT applications. Specifically, the present application is directed towards a low-cost, low thermal budget photodiode array having low crosstalk effects. More specifically, the present application is directed towards a front-side illuminated, back-side contact (FSL-BSC) photodiode arrays having superior characteristics, including low manufacturing cost via thermal budget processing; low crosstalk effects owing to active area isolation; and front to back intrachip electrical connections.

In one embodiment, the FSL-BSC photodiode array of the present application is designed and fabricated to provide virtually zero susceptibility to crosstalk effects at a reduced cost. The FSL-BSC photodiode array comprises at least a plurality of heterogeneous, heavily doped deep regions that 1) form front to back side electrical connection and 2) achieve active area isolation. More particularly, the photodiode array of the present application has virtually zero crosstalk effects as a result of the active area isolation obtained by the deep diffusion of the n+ zones.

Still more specifically, the FSL-BSC photodiode array of the present application comprises at least one heavily doped regions, including, but not limited to, n+ deep diffused, p+ deep diffused, and p+ simple diffused. In one embodiment, the n+ and p+ deep diffusions facilitate formation of a front to back electrical connection. In another embodiment, n+ deep diffusions are employed to isolate individual photodiode unit active areas to reduce leakage current and crosstalk.

In one embodiment, the present application comprises a photodiode array further comprising a plurality of front-side illuminated photodiodes and back-side anode and cathode contacts.

In one embodiment, the FSL-BSC photodiode array of the present application is manufactured using a deep diffusion process, wherein n+ deep diffused and p+ deep diffused regions are formed concurrently on the front and back sides of the substrate wafer, resulting in identical diffusion depths in half the time. Thus, the cost of manufacturing is significantly reduced.

Various modifications to the preferred embodiment will be readily apparent to those of ordinary skill in the art, and the disclosure set forth herein may be applicable to other embodiments and applications without departing from the spirit and scope of the present invention and the claims hereto appended. Thus, the present invention is not intended to be limited to the embodiments described, but is to be accorded the broadest scope consistent with the disclosure set forth herein.

Figure 1:
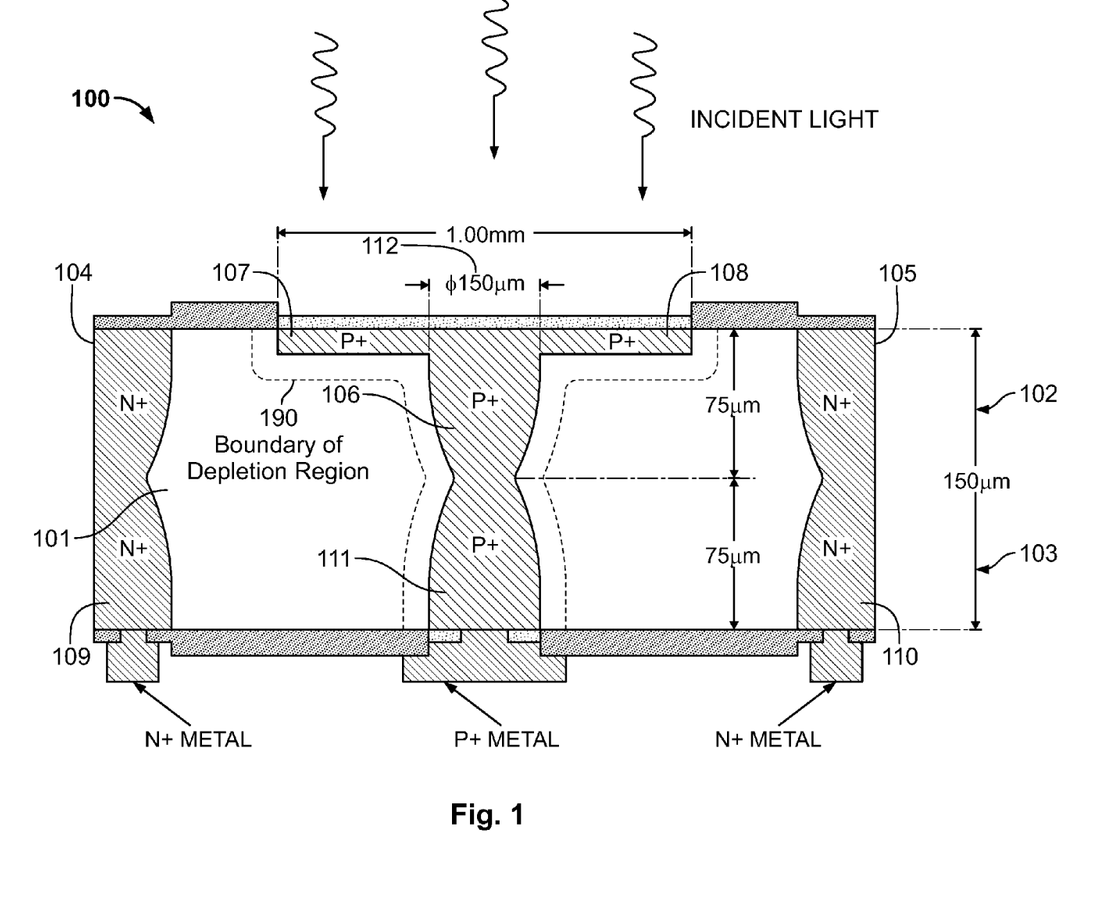
FIG. 1 is a detailed illustration of one embodiment of the low crosstalk, front-side illuminated, back-side contact (FSL-BSC) photodiode array of the present invention.

FIG. 1 is a cross-sectional view of single crystal semiconductor substrate or device wafer 101, having a plurality of photodiodes positioned in an array. Device wafer 101 may be made up of various materials, such as, but not limited to, Si or Ge. In one embodiment, device wafer has a thickness of 150 µm. The crystal orientation of wafer 101 is preferably <1-0-0>. Both the front side and back side of wafer 101 are selectively etched, at appropriate positions via a suitable etching technique to form deep diffused regions therein, thus isolating active areas and as a result, substantially reducing crosstalk effects.

The FSL-BSC photodiode array may be fabricated using a plurality of diffusion processes. In one embodiment, the photodiode array of the present invention is fabricated using an appropriate low thermal budget deep diffusion process, comprising at least one diffusion and/or drive-in step. In another embodiment, the diffusion and/or drive-in is performed on both the front-side and back-side simultaneously to achieve identical diffusion depths with greater efficiency. In another embodiment, the diffusion is performed in half the traditional time and thus results in reduced manufacturing cost. At least one, but preferably a plurality of heterogeneous, heavily doped deep diffusion regions, such as n+ and p+ type doped regions, are obtained as a result of this low cost, low thermal budget deep diffusion process. The manufacturing process of the FSL-BSC photodiode array of the present invention is described in greater detail below.

In one embodiment, at least a portion of substrate wafer 101 is apportioned into two regions, first region 102 and second region 103, having a suitable thickness. For example, but not limited to such example, first region 102 and second region 103 each has a thickness of 75 µm.

It should be understood by those of ordinary skill in the art that any number of regions having variable thicknesses may be selected as suitable for the FSL-BSC photodiode of the present invention. Thus, the above specifications are not limited to those recommended herein and can be easily changed to suit varying design, fabrication, and functional requirements suggested herein.

In one embodiment, first region 102 comprises a plurality of heavily doped regions. Preferably, adjacent heavily doped regions are of different impurities of different conductivity types. For example, but not limited to such example, first region 102 may comprise a heavily doped deep region, located near the top left hand side of the photodiode, 104 and a heavily doped region, located near the top right hand side of the photodiode, 105, each doped with a suitable impurity of a first conductivity type, such as either p-type or n-type. In addition, first region 102 further comprises deep diffused region 106, located in the middle of the photodiode, and shallow regions 107, located below and on a left side of the active area, and 108, located below and on a right side of the active area, each doped with a suitable impurity of a second conductivity type, opposite that of the first conductivity type, either p-type or n-type.

For example, but not limited to such example, if regions 104 and 105 are doped with a suitable impurity of a first conductivity type wherein the first conductivity type is n-type, then regions 106, 107 and 108 are doped with a suitable impurity of a second conductivity type, wherein the second conductivity type is p-type. In one embodiment, first region 102 is proximate to the front side of wafer 101. In one embodiment, boron (B) and phosphorus (P) are the preferred p- and n-type dopants employed to create the p+ and n+ regions. It should be understood to those of ordinary skill in the art that any suitable doping material may be used. Preferably, heavily doped deep diffusion regions 104, 105 and 106 have a depth of 75 µm.

In one embodiment, second region 103 comprises a plurality of heavily doped regions. Preferably, adjacent heavily doped regions are of different impurities of different conductivity types.

For example, but not limited to such example, second region 103 may comprise heavily doped deep regions 109, located near the bottom left side of the photodiode, and 110, located near the bottom right side of the photodiode, doped with a suitable impurity of a first conductivity type, such as either p-type or n-type. In addition, second region 103 further comprises heavily doped deep region 111, located in the middle of the photodiode and below region 106, doped with a suitable impurity of a second conductivity type, opposite that of the first conductivity type, either p-type or n-type. For example, but not limited to such example, if regions 109 and 110 are doped with a suitable impurity of a first conductivity type wherein the first conductivity type is n-type, then region 111 is doped with a suitable impurity of a second conductivity type, wherein the second conductivity type is p-type. In one embodiment, second region 103 is proximate to the back side of wafer 101. Boron (B) and phosphorus (P) are the preferred p- and n-type dopants employed to create the p+ and n+ regions. It should be understood to those of ordinary skill in the art that any suitable doping material may be used. Preferably, heavily doped deep diffusion regions 109 and 110 have a depth of 75 μm.

The photodiode 100 further comprises at least one active area 112, containing surfaces upon which light impinges. It should be understood by those of ordinary skill in the art that active area 112 may be designed and fabricated using conventionally known techniques. Typically, the active area in a photodiode array is either round or square in shape, however, there is no restriction on the shape or geometry of these active areas and any number of shapes may be used, including but not limited to triangular, elliptical, or trapezoidal. Conventionally, the geometric dimensions and size of the active area can be held to tolerances of 2 microns. For example, and by no way of limitation, active area photolithography may be employed to design and fabricate active area 112. In one embodiment, active area 112 has a width of 1.00 mm. As mentioned above, active area(s) 112 are electrically isolated from each of its neighboring active area(s). The boundary of the depletion region is designated by area 190.

In one embodiment, heavily doped deep regions are simultaneously diffused onto both the front-side and back-side of substrate wafer 101, as described with respect to FIG. 1 and described in greater detail below. Thus, regions 104, 105, 106, 109, 110, and 11, are manufactured having appropriate specifications in accordance with the methods of the present invention. It should be understood by those of ordinary skill in the art that a variety of modifications may be made to the embodiment described above. Thus, the present invention is not intended to be limited to the embodiments described, but is to be accorded the broadest scope consistent with the disclosure set forth herein.

The manufacturing process of the FSL-BSC photodiode array of the present invention will now be described in greater detail. In one embodiment, the FSL-BSC photodiode array of the present invention is designed and fabricated to provide substantially low susceptibility to crosstalk effects at a reduced cost. The FSL-BSC photodiode array comprises at least a plurality of heterogeneous, heavily doped deep regions that 1) form front to back side electrical connection and 2) achieve active area isolation. More particularly, the photodiode array of the present invention has substantially low crosstalk effects as a result of the active area isolation obtained by the deep diffusion of the n+ zones. It should be noted herein that although one exemplary manufacturing process is described herein, various modifications may be made without departing from the scope and spirit of the invention.

FIGS. 2a-2j illustrates one embodiment of the manufacturing steps of the FSL-BSC photodiode array of the present invention. The manufacturing steps described herein provide one manufacturing example of the photodiode array of the present invention. Modifications or alterations to the manufacturing steps, their corresponding details, and any order presented may be readily apparent to those of ordinary skill in the art. Thus, the present invention contemplates many possibilities for manufacturing the photodiode array of the present invention and is not limited to the examples provided herein.

Figure 2A:
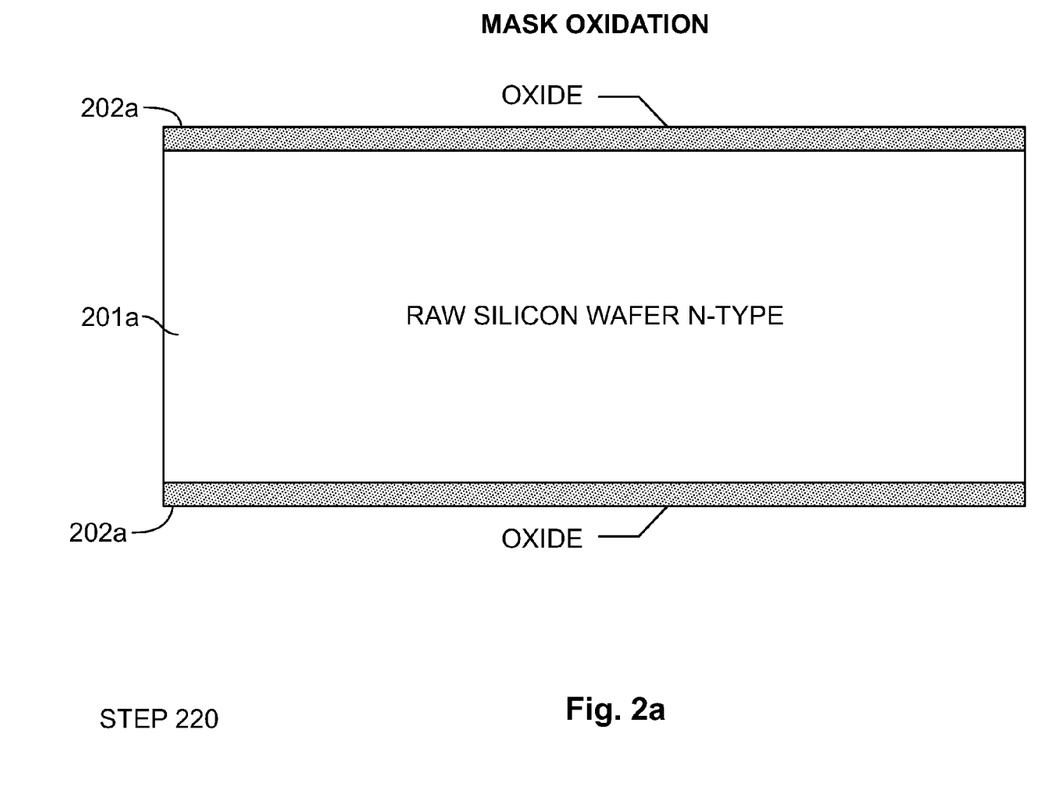
FIGS. 2a-2j illustrate one embodiment of the manufacturing steps of the low crosstalk, front-side illuminated, back-side contact (FSL-BSC) photodiode array of the present invention.

Referring now to FIG. 2a, start material is a device wafer 201a, is preferably Si, is preferably n-type and is approximately 150 μm thick. In addition, device wafer 201a is polished on both sides to allow for greater conformity to parameters, surface flatness, and specification thickness. It should be understood by those of ordinary skill in the art, however, that the above specifications are not binding and that the type of material and wafer size can easily be changed to suit the design, fabrication, and functional requirements of the present invention.

In step 220, device wafer 201a is subjected to a standard mask oxidation process that grows a mask oxide layer 202a on both the front-side and back-side of the device wafer. In one embodiment, the oxidation mask is made of $SiO_2$ or $Si_3N_4$ and thermal oxidation is employed to achieve mask oxidation. Standard mask oxidation is well known to those of ordinary skill in the art and will not be described in further detail herein.

Figure 2B:
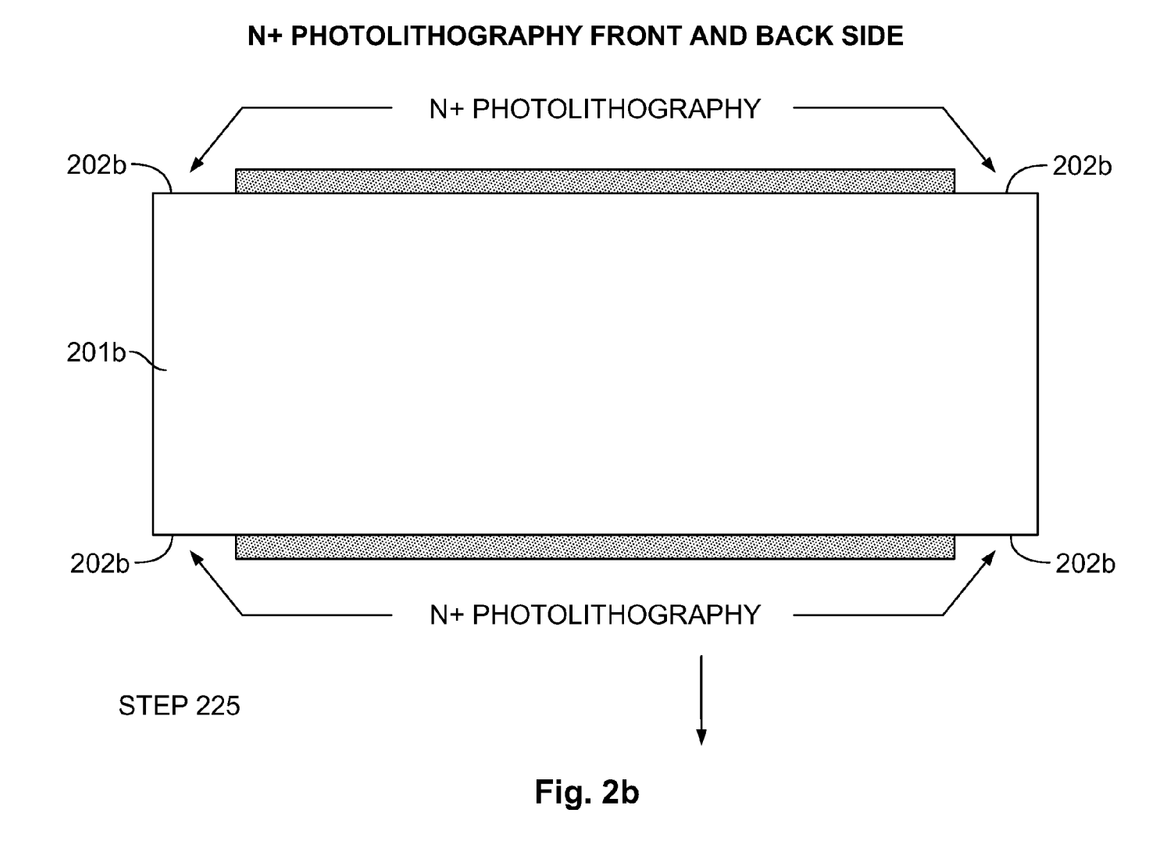

As shown in FIG. 2b, after the standard mask oxidation is complete, the device wafer is subjected to n+ photolithography on both the front-side and back-side of device wafer 201b in step 225. Photolithography includes employing a photoresist layer to etch a specific pattern on the surface of the wafer. Generally, the photoresist layer is a photosensitive polymeric material for photolithography and photoengraving that can form a patterned coating on a surface. After selecting a suitable material and creating a suitable photoresist pattern, a thin photoresist layer is applied to both the front side and back side of device wafer 201b. In one embodiment, the photoresist layer is applied via a spin coating technique. Spin coating is well-known to those or ordinary skill in the art and will not be described in detail herein. The photoresist layer is then appropriately treated to reveal n+ diffusion regions.

In an optional step, the device wafer is subjected to n+ masking N+ masking is employed to protect portions of device wafer 201b. Generally, photographic masks are high precision plates containing microscopic images of preferred pattern or electronic circuits. They are typically fabricated for flat pieces of quartz or glass with a layer of chrome on one side. The mask geometry is etched in the chrome layer. In one embodiment, the n+ mask comprises a plurality of diffusion windows with appropriate geometrical and dimensional specifications. The photoresist coated device wafer 201b is aligned with the n+ mask. An intense light, such as UV light, is projected through the mask, exposing the photoresist layer in the pattern of the n+ mask. The n+ mask allows selective irradiation of the photoresist on the device wafer. Regions that are exposed to radiation are hardened while those that are reserved for deep diffusion remain shielded by the n+ mask and easily removed. The exposed and remaining photoresist is then subjected to a suitable chemical or plasma etching process to reveal the pattern transfer from the mask to the photoresist layer. An etching process is then employed to remove the silicon dioxide layer. In one embodiment, the pattern of the photoresist layer and/or n+ mask defines at least one region 202b devoid of the oxide layer deposited in step 220 and ready for n+ diffusion.

Figure 2C:
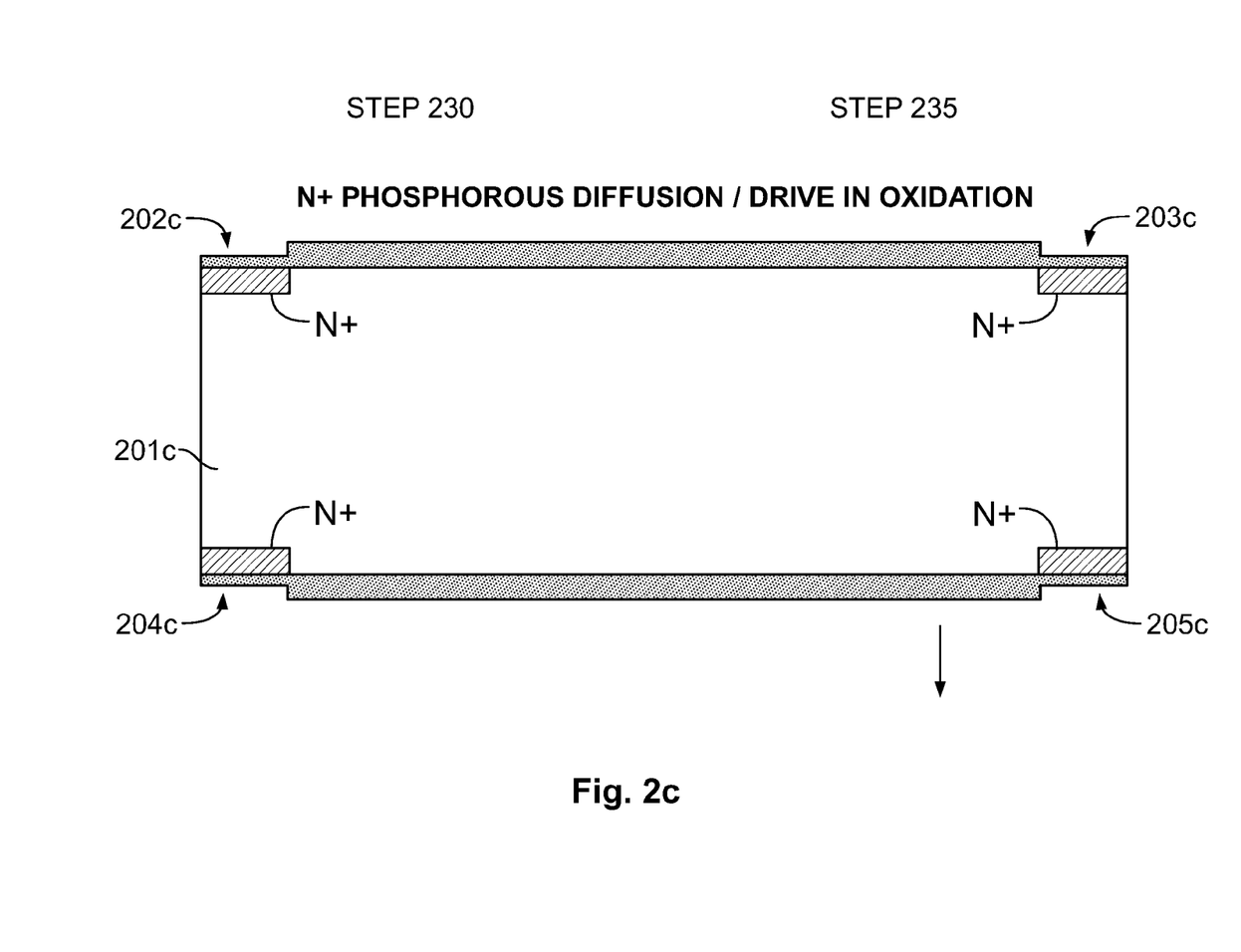

Now referring to FIG. 2c, in step 230, device wafer 201c is subjected to n+ diffusion followed by drive-in oxidation after the n+ masking and etching step. Generally, diffusion facilitates propagation of a diffusing material through a host material. In a semiconductor wafer fabrication process, diffusion is employed to convert exposed portions of an n-type silicon wafer into a p-type silicon wafer, or vice versa. In step 230, an appropriate amount of dopant atoms is deposited onto the substrate wafer and fills the gaps left by the removed photoresist layer. Then, the wafer is subjected to a drive-in oxidation process that is used to redistribute the dopant atoms and deposit them deeper into the wafer. In addition, exposed silicon surfaces are oxidized.

In one embodiment, the simultaneous front side and backside deep diffusion involves using a suitable dopant of n-type conductivity. In one embodiment, simultaneous front-side and back-side diffusion on device wafer 201c may be achieved by using a liquid dopant source and rapid thermal processing (RTP). U.S. Pat. No. 5,928,438, is assigned to Salami et al and teaches rapid thermal processing and is herein incorporated by reference. In one embodiment, phosphorus is used as a dopant. Many approaches to the diffusion process are well-known to those of ordinary skill in the art and will not be discussed in detail herein. It should be noted, however, that the choice of diffusion method is dependent on many factors, including but not limited to the diffusion coefficient of the dopant, permissible error in the diffusion depth, and the diffusion source.

The resultant n+ deep diffusion regions are then subjected to, in step 235, high temperature drive-in oxidation, thus driving the dopant deeper into wafer 201c. Nuisance effects, which transpire when superfluous drive-in steps occur as an artifact of the overall process, tend to be a key problem in drive-in diffusion. More specifically, nuisance effects are compounded during each subsequent high temperature drive-in step, which cases further diffusion of the dopant into the substrate. Accounting of subsequent alterations during each high temperature step involved in the overall process is known as thermal budgeting. Thus, the thermal budget of an overall process is dependent on the number of steps.

In one embodiment, the low thermal budget deep diffusion process used to manufacture the FSL-BSC photodiode of the present invention comprises three steps: a first deposition/diffusion step, a second drive-on oxidation step, and a third drive-in oxidation step. The three-step example provided above is by way of example only and no way limiting to the present invention. It should be understood by those of ordinary skill in the art that any number of steps may be performed, keeping in mind overall cost efficiency and thermal budget of the device.

Figure 2D:
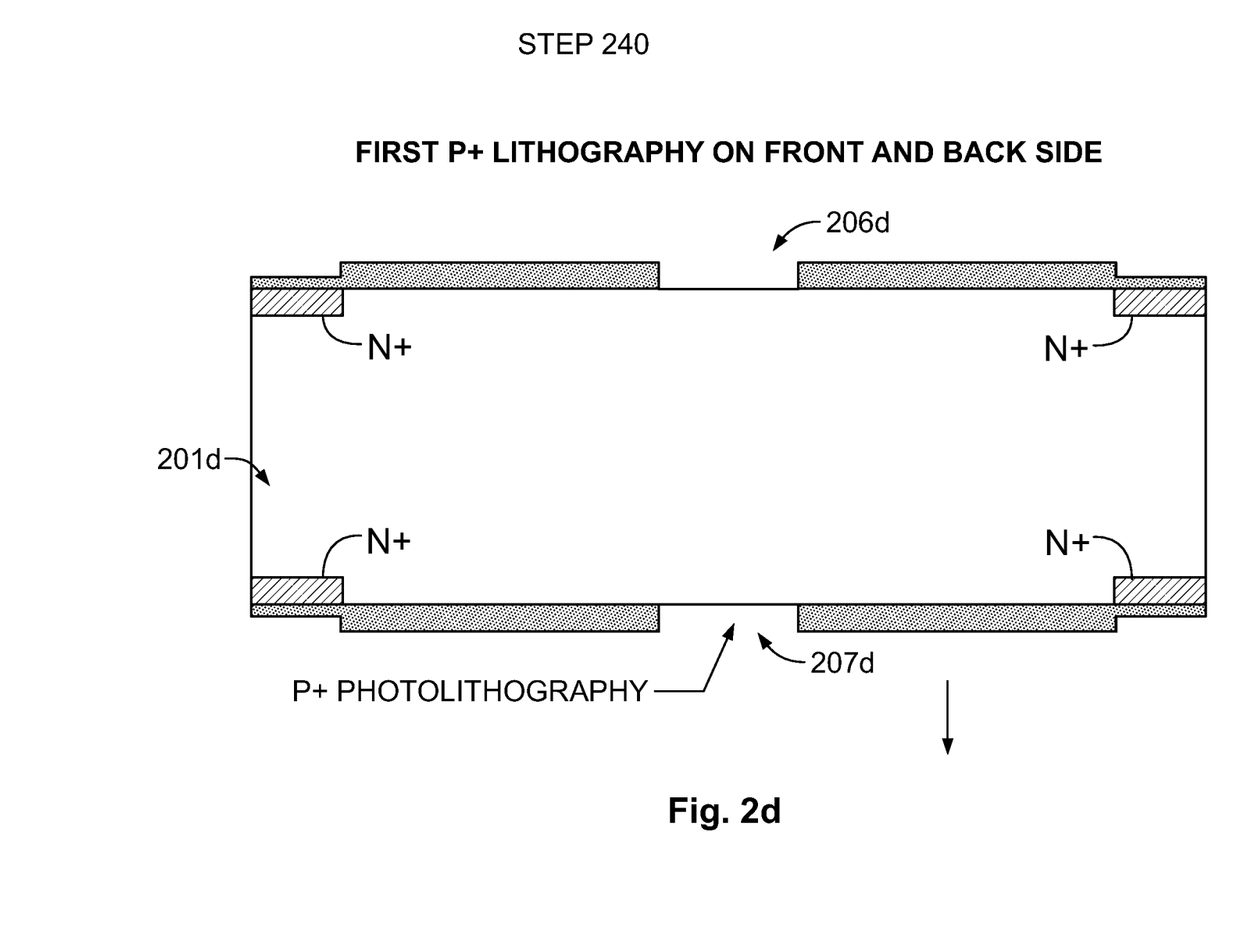

Referring now to FIG. 2d, in step 240, both the front side and back side of the device wafer 201d undergo a first p+ photolithography process, creating regions 206d and 207d. As with any conventional photolithographic process, p+ photolithography comprises at least the following tasks, but is not limited to such tasks: substrate preparation; photoresist application; soft baking; mask alignment; exposure; development, hard baking, and etching. In addition, various other chemical treatments may be performed.

Figure 2E:
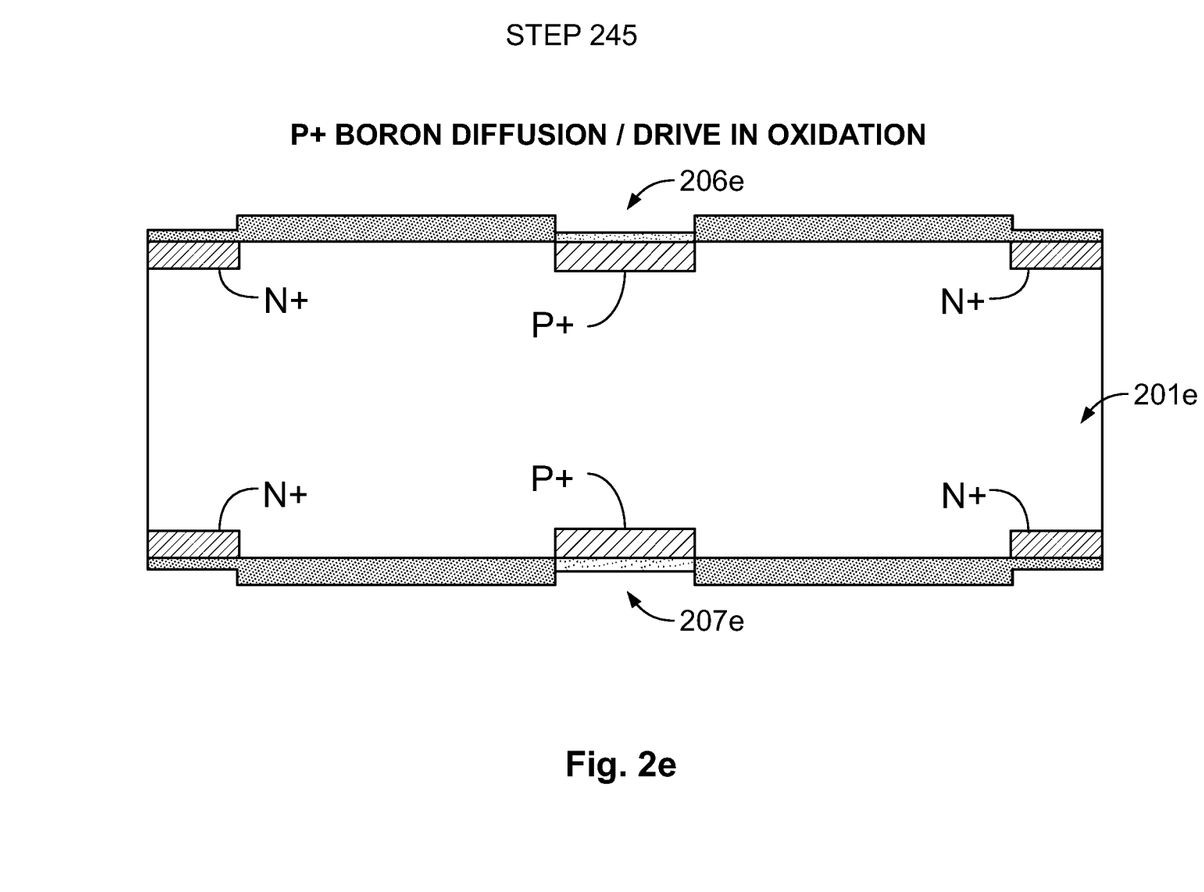

As shown in FIG. 2e, regions 206e and 207e are subject to p+ masking and diffusion in step 245. The p+ masking and diffusion process is similar to that delineated with respect to the n+ masking process described above and will not be repeated in detail herein. The p+ masking process of step 245 further comprises deposition and drive-in oxidation, allowing for predefined and/or predetermined thermal budget in accord with the principles of the present invention. In one embodiment, the p+ dopant is boron.

Figure 2F:
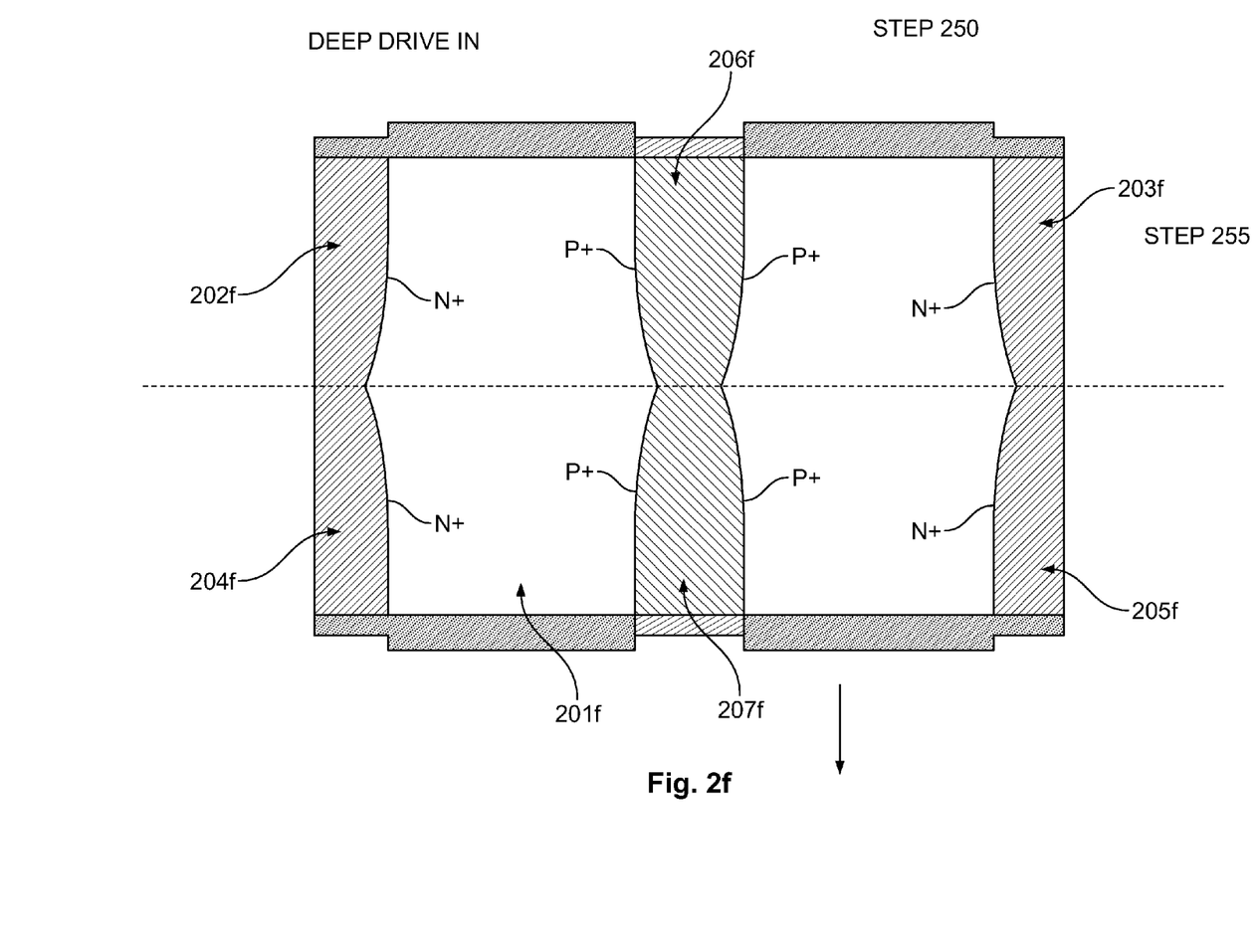

In step 250, as shown in FIG. 2f, the p+ boron diffusion/drive-in oxidation process is followed by a p+ deep drive-in/diffusion step in which regions 206f and 207f are diffused deeply via a high temperature deep drive-in process. In step 255, as shown in FIG. 2f, regions 202f, 203f, 204f, and 205f are subjected to high temperature n+ deep drive-in oxidation step, thus deepening the n+ doped regions. The rate of diffusion is directly proportional to the temperature, provided that the concentration gradient is invariable. For example, but not limited to such example, at temperatures ranging from a minimum of 850° C. to a maximum of 1150° C., chemical impurities (dopants) selectively propagate through crystalline lattice structure of a semiconductor material to alter its characteristics.

Figure 2G:
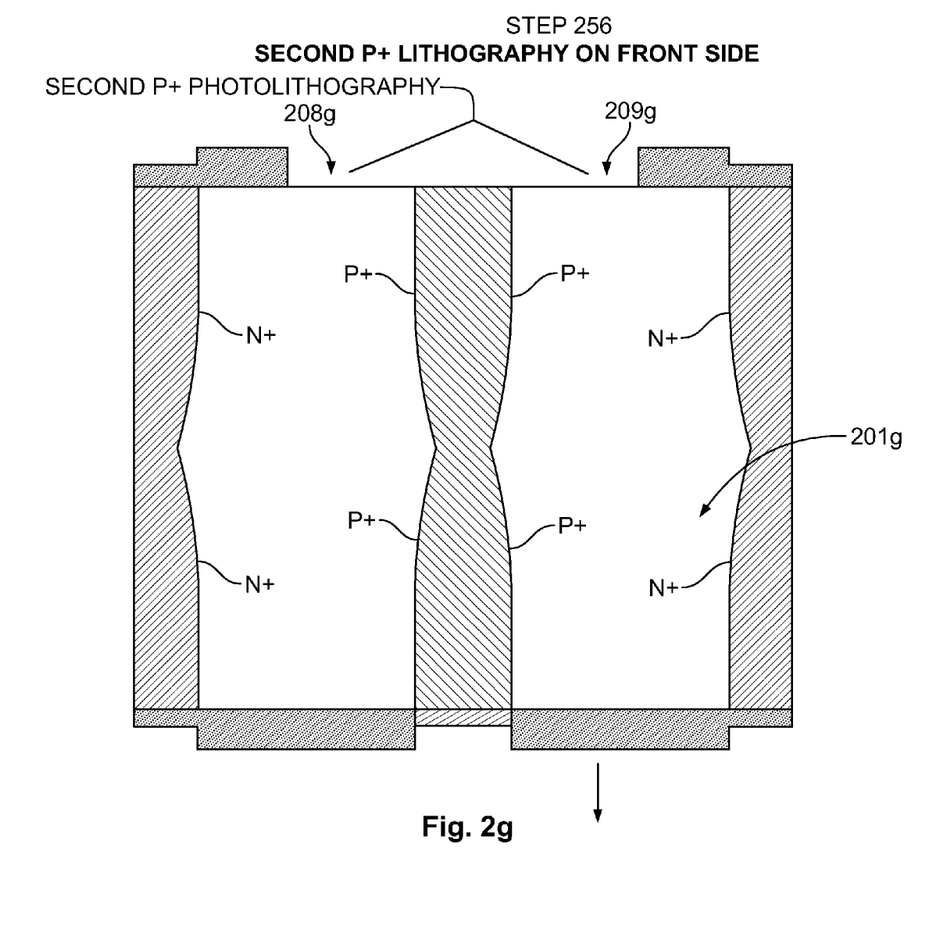

Referring now to FIG. 2g, the front side of device wafer 201g is subjected to a second p+ lithography process in step 256. In one embodiment, the second p+ lithography process defines regions 208g and 209g. It should be noted that in step 256, unlike with other steps in this manufacturing process, only the front side of wafer device 201g is subjected to the second p+ lithography process. Persons of ordinary skill in the art should be well-versed with photolithography techniques and thus details of such techniques are not repeated herein.

Figure 2H:
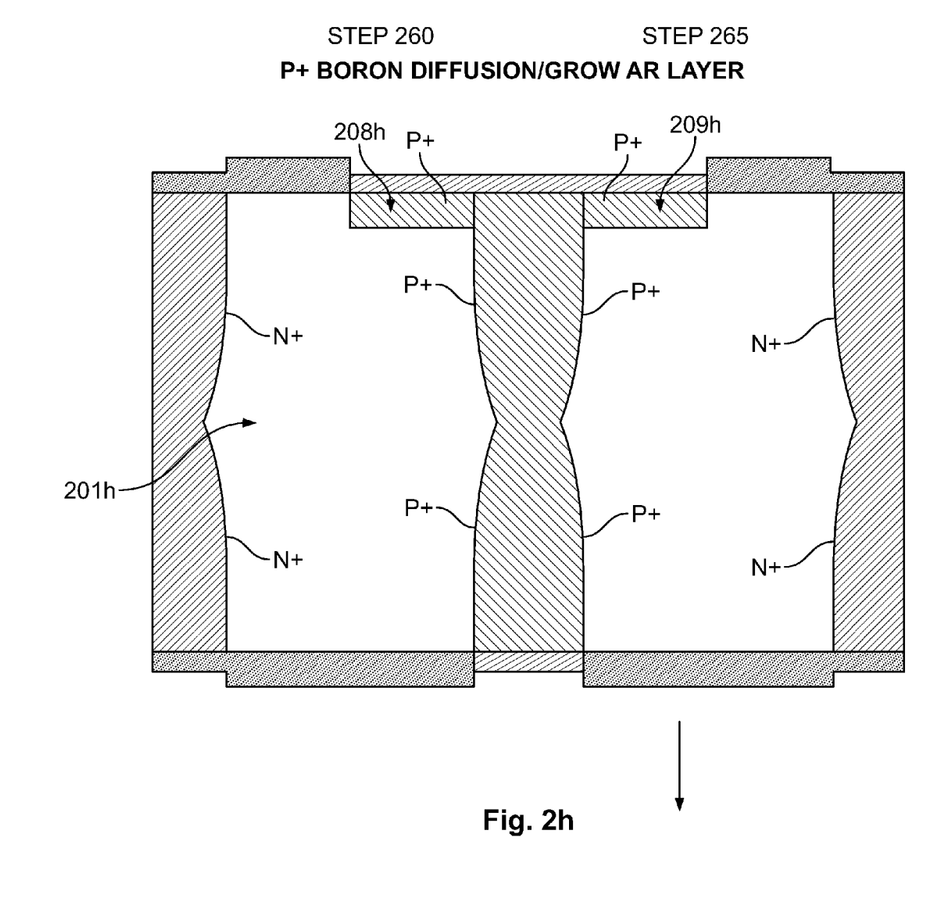

As shown in FIG. 2h, regions 208h and 209h on front side of wafer device 201h, are then subjected to p+ diffusion in step 260. In one embodiment, the dopant is boron. The second p+ layer 107, 108, created by the second p+ masking and doping steps, represents the p+ active area of each element in the photodiode array. Short wavelength light, such as 480 nm light emitted from scintillator crystals, is incident upon this shallow p+ active area layer. Electron hole pairs, photo-generated in the depletion layer, are immediately collected in the depletion region of this shallow junction, resulting in high speed, high quantum efficiency of the frontside-illuminated, backside-contact photodiode array, even when operated in zero-bias photovoltage mode.

In step 265, an anti-reflective (AR) layer is grown on the front-side and back-side of the device, covering only the p+ diffused areas, via thermal oxidation. Various anti-reflective coating designs, such as 1 layer, 2 layer, 3 layer, and 4+ layers may be employed. By way of example, and by no means limiting, the 1-layer anti-reflective coating design adopted herein utilizes thin film materials, such as oxides, sulfides, fluorides, nitrides, selenides, metals, among others. In one embodiment of the present invention, the antireflective layer comprises $SiO_2$ AR (i.e. silicon dioxide antireflective). Preferably the $SiO_2$ AR layer has a thickness of 900 Å.

Figure 2I:
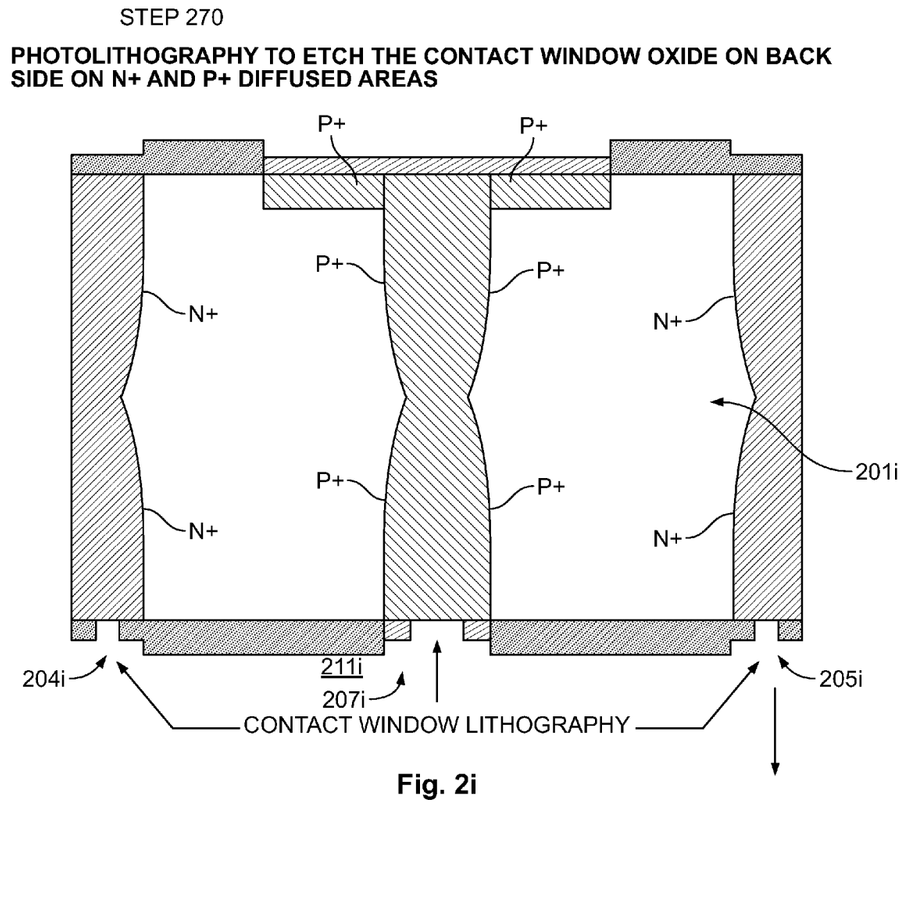

As shown in FIG. 2i, in step 270, a contact etch mask is used to etch a contact window into the back side of the wafer. The contact window is formed on the back side of the treated substrate wafer by using standard semiconductor technology photolithography techniques. The contact window oxide can then be removed by either standard wet or standard dry etching techniques as are well known to those of ordinary skill in the art.

More specifically, and not limited to such example, in one embodiment of the photodiode array of the present invention, a contact window mask is first applied, followed by etching with a contact window oxide on n+ deep diffused regions 204i, 205i, and p+ deep diffused region 207i, all on the back side of device wafer 201i. Contact lithography, well-known to those of ordinary skill in the art, involves printing an image or pattern via illumination of a photomask in direct contact with a substrate coated with an imaging photoresist layer.

In one embodiment, a plurality of contact windows 211i are formed on the back side of the device wafer as shown in FIG. 2i, using a contact window mask. Typically, a contact window is an aperture defined in a surface passivation layer through which device metallization develops contact with circuit elements. In one embodiment, the contact window mask is a dark field mask, which is used to remove the silicon oxide layer in both n-type and p-type regions requiring contacts. While contact masks have conventionally been fairly large (on the order of 100 mm or higher), it is possible that alignment tolerances may necessitate smaller mask sizes to allow stepping between exposures. As in nano-imprint lithography, the mask needs to have roughly the same feature size as the desired image.

Using the contact mask, at least one or a plurality of contact windows 211i are opened through the protective oxide layer deposited on the surface of device wafer 201i. In one embodiment, contact window etching is achieved via a chemical etching process, wherein the wafer is immersed in a buffered oxide etch (BOE), a HF acid-based solution for intervals sufficient enough to remove the layers exposed by the contact window mask.

Figure 2J:
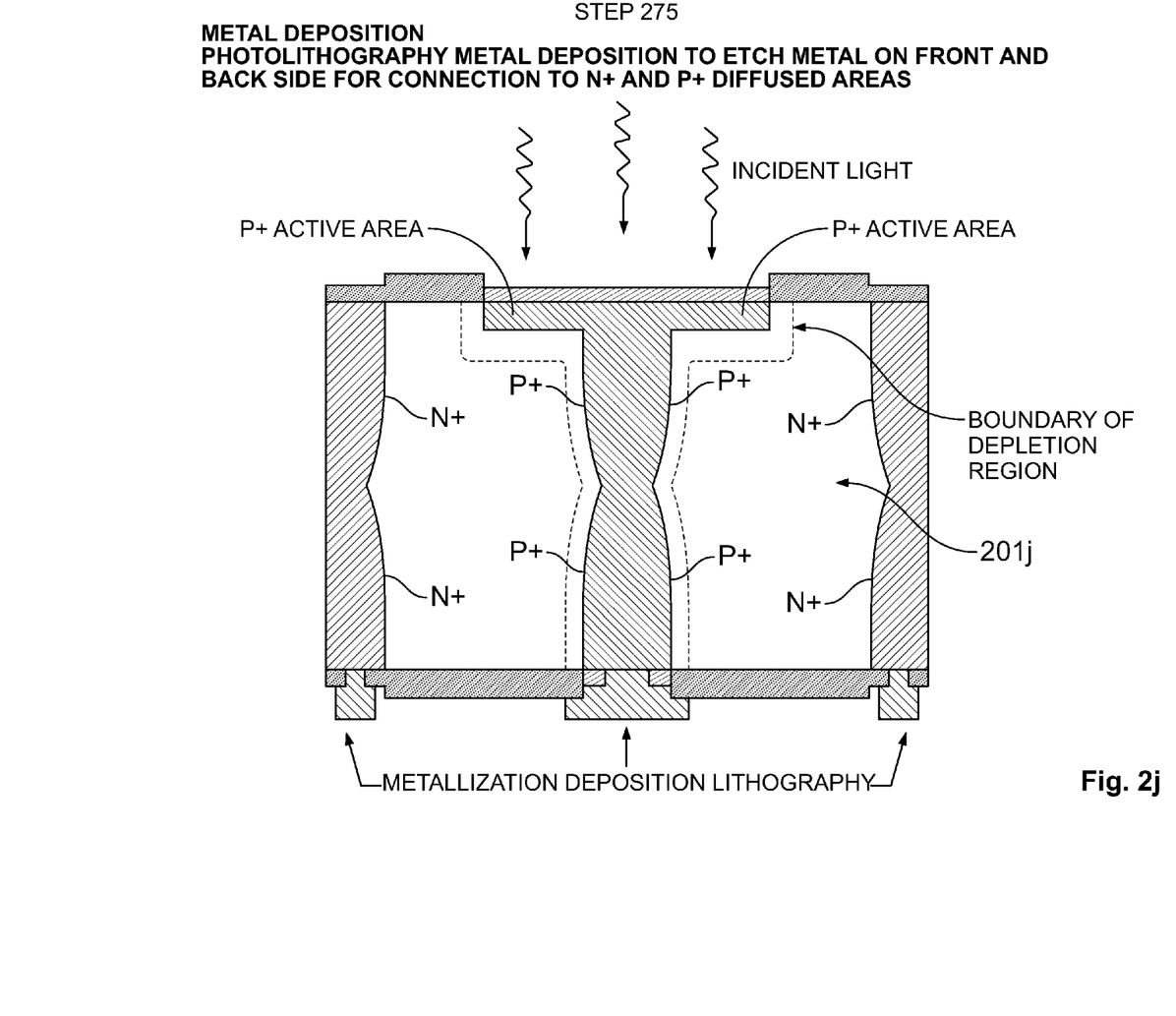

As shown in FIG. 2j, the device wafer 201j is subjected to a metal deposition process 275 to etch metal on the back side of the wafer for creating electrical connections to n+ and p+ diffused areas. In the metal deposition process, also called metallization, metal layers are deposited on the wafer to create conductive pathways. The most common metals include aluminum, nickel, chromium, gold, germanium, copper, silver, titanium, tungsten, platinum, and tantalum. Selected metal alloys may also be used. Metallization is often accomplished with a vacuum deposition technique. The most common deposition processes include filament evaporation, electron-beam evaporation, flash evaporation, induction evaporation, and sputtering, followed by metal masking and etching. Metal etching can be performed in a variety of methods, including, but not limited to abrasive etching, dry etching, electroetching, laser etching, photo etching, reactive ion etching (RIE), sputter etching, and vapor phase etching.

The above examples are merely illustrative of the many applications of the system of present invention. Although only a few embodiments of the present invention have been described herein, it should be understood that the present invention might be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. A photodiode, wherein said photodiode comprises:
   a substrate having a front side and a back side;
   an active area positioned on said front side;
   a first deep diffusion region formed within said substrate, located on a left side of said substrate, and extending from said front side to said back side;
   a second deep diffusion region formed within said substrate, located on a right side of said substrate, and extending from said front side to said back side; and
   a depletion region around said active area, wherein the first deep diffusion region and the second deep diffusion region are separated by said depletion region and the active area within the photodiode and wherein the first deep diffusion region and the second deep diffusion region each comprises deep diffused regions of a first conductivity type.

2. The photodiode array of claim 1, further comprising a plurality of electrical contacts attached to said back side.

3. The photodiode array of claim 1, further comprising, within said substrate, a shallow diffused region of a second conductivity type directly under said active area, wherein said second conductivity type is different than the first conductivity type.

4. The photodiode array of claim 3, further comprising, within said substrate, a third deep diffused region of the second conductivity type extending from said shallow diffused region to said back side.

5. The photodiode array of claim 4, wherein the first conductivity type is n+ and the second conductivity type is p+.

6. The photodiode array of claim 1, further comprising a plurality of electrical contacts attached to said back side, wherein at least one of the plurality of electrical contacts is in contact with each of said first deep diffusion region and said second deep diffusion region.

7. The photodiode array of claim 1, wherein the substrate comprises silicon.

8. The photodiode array of claim 1, wherein the front side of the substrate forms a front side of a wafer containing said substrate and the back side of the substrate forms a back side of the wafer containing said substrate respectively.

9. The photodiode array of claim 1, wherein the photodiode is a part of a front side illuminated backside contact photodetector array.

10. The photodiode array of claim 1, wherein said substrate has a thickness of approximately 150 μm.

11. The photodiode array of claim 1, wherein said active area has a width of approximately 1 mm.

* * * * *